US009229290B2

(12) United States Patent
Wang

(10) Patent No.: US 9,229,290 B2
(45) Date of Patent: Jan. 5, 2016

(54) PIXEL STRUCTURE, ARRAY SUBSTRATE AND DISPLAY DEVICE

(71) Applicants: BOE Technology Group Co., Ltd., Beijing (CN); Ordos Yuansheng Optoelectronics Co., Ltd., Ordos, Inner Mongolia (CN)

(72) Inventor: Xuelu Wang, Beijing (CN)

(73) Assignees: BOE Technology Group Co., Ltd., Beijing (CN); Ordos Yuansheng Optoelectronics Co., Ltd., Ordos, Inner Mongolia (CN)

( * ) Notice: Subject to any disclaimer, the term of this patent is extended or adjusted under 35 U.S.C. 154(b) by 0 days.

(21) Appl. No.: 14/360,558

(22) PCT Filed: Dec. 5, 2013

(86) PCT No.: PCT/CN2013/088665
§ 371 (c)(1),
(2) Date: May 23, 2014

(87) PCT Pub. No.: WO2015/000260
PCT Pub. Date: Jan. 8, 2015

(65) Prior Publication Data
US 2015/0014694 A1 Jan. 15, 2015

(30) Foreign Application Priority Data
Jul. 2, 2013 (CN) .......................... 2013 1 0274803

(51) Int. Cl.
*H01L 27/14* (2006.01)
*G02F 1/1362* (2006.01)
(Continued)

(52) U.S. Cl.
CPC .... *G02F 1/136286* (2013.01); *G02F 1/134363* (2013.01); *H01L 27/124* (2013.01)

(58) Field of Classification Search
None
See application file for complete search history.

(56) References Cited

U.S. PATENT DOCUMENTS

2006/0256268 A1* 11/2006 Jeong et al. .................. 349/141
2007/0070282 A1 3/2007 Shibahara et al.
(Continued)

FOREIGN PATENT DOCUMENTS

CN 102854670 A 1/2013
CN 103336393 A 10/2013
(Continued)

OTHER PUBLICATIONS

Notification of the First Office Action from Chinese Patent Office for priority application CN 201310274803.1 dated Apr. 3, 2015 with English translation.
(Continued)

*Primary Examiner* — Khaja Ahmad
(74) *Attorney, Agent, or Firm* — Frommer Lawrence & Haug LLP

(57) ABSTRACT

A pixel structure, an array substrate and a display device are provided. The invention relates to the field of liquid crystal display technology, and can solve the problem of large shadow zones formed between slit electrodes in the existing pixel structure. The pixel structure of the invention comprises a slit electrode and a plate electrode. The slit electrode includes at least two layers, each of which includes a plurality of strip-shaped electrode sections and a plurality of slits located between the adjacent electrode sections, the electrode sections in an upper layer are positioned over the slits in a lower layer, projections of the electrode sections in the layers on a substrate are not overlapped with each other, and the layers are separated from each other by a first insulation layer. The plate electrode is provided under the slit electrode and separated from the slit electrode by a second insulation layer.

19 Claims, 2 Drawing Sheets

(51) Int. Cl.
    *H01L 27/12*   (2006.01)
    *G02F 1/1343*   (2006.01)

(56) References Cited

U.S. PATENT DOCUMENTS

| | | | |
|---|---|---|---|
| 2007/0153175 A1* | 7/2007 | Chang | G02F 1/133504 349/114 |
| 2009/0185125 A1 | 7/2009 | Hida et al. | |
| 2009/0262286 A1* | 10/2009 | Nishida | 349/114 |
| 2011/0234935 A1* | 9/2011 | Konno | G02F 1/134363 349/43 |
| 2011/0285931 A1* | 11/2011 | Kimura | G02F 1/133555 349/46 |
| 2012/0182511 A1 | 7/2012 | Hisada et al. | |
| 2014/0016075 A1* | 1/2014 | Iwata et al. | 349/141 |

FOREIGN PATENT DOCUMENTS

| | | |
|---|---|---|
| CN | 203502707 U | 3/2014 |
| WO | WO 2012/128084 A | 9/2012 |
| WO | WO 2012128084 A1 * | 9/2012 |

OTHER PUBLICATIONS

Notification of the Second Office Action from Chinese Patent Office for priority application CN 201310274803.1 dated Jun. 3, 2015.
English translation of Written Opinion issued during international phaseof PCT/CN2013/088665.

* cited by examiner

PIXEL STRUCTURE, ARRAY SUBSTRATE AND DISPLAY DEVICE

This application is a 371 of PCT/CN2013/088665 filed on Dec. 5, 2013, which claims priority benefits from Chinese Patent Application Number 201310274803.1 filed Jul. 2, 2013, the disclosure of which is incorporated herein by reference.

FIELD OF THE INVENTION

The present invention relates to the field of liquid crystal display technology, and particularly to a pixel structure, an array substrate and a display device.

BACKGROUND OF THE INVENTION

Thin Film Transistor Liquid Crystal Display (TFT-LCD) is a dominant Flat Panel Display (FPD).

According to the direction of the electric field for driving liquid crystal, TFT-LCD may be classified into two categories: vertical electric field type and horizontal electric field type. As for the vertical electric field type TFT-LCD, it is required to form a pixel electrode on an array substrate and form a common electrode on a color substrate, while as for the horizontal electric field type TFT-LCD, it is required to form both the pixel electrode and the color substrate on the array substrate. The horizontal electric field type TFT-LCD, especially ADS type TFT-LCD is applied widely in the field of liquid crystal display technology due to its advantages such as wide view angle, high aperture ratio, and so on.

As shown in FIG. 1, ADS type TFT-LCD may be classified into various kinds. However, these various kinds of ADS type TFT-LCD have a common characteristic that the horizontal electric field is formed by a plate electrode 102 and a slit electrode 103, wherein the plate electrode 102 may serve as the common electrode and the slit electrode 103 may serve as the pixel electrode, and vice versa.

As shown in conjunction with FIG. 2, the ADS type TFT-LCD includes the plate electrode 102 provided on the substrate 101, and a layer of the slit electrode 103 located above the plate electrode 102 and separated from the same by an insulation layer 104. The slit electrode 103 includes strip-shaped electrode sections 1031 and slits 1032. The materials for both the slit electrode 103 and the plate electrode 102 may be transparent indium tin oxide (ITO) and the like. However, the existing design of one-layer slit electrode 103 may result in uneven distribution of electric field. It can be seen from FIG. 2 that wide shadow zones Q1 may be formed at positions corresponding to the slits 1032 of the slit electrode 103, which reduces transmittance and thereby decreases user's satisfaction degree with respect to the product performance.

SUMMARY OF THE INVENTION

The technical problems to be solved by the present invention include a problem of large shadow zones formed between the slit electrodes in the existing pixel structure. Aiming at solving this problem, the present invention provides a pixel structure, an array substrate and a display device which can reduce the area of the shadow zones.

In order to solve the problem, the present invention provides a pixel structure comprising a slit electrode and a plate electrode, wherein the slit electrode includes at least two layers, each of which includes a plurality of strip-shaped electrode sections and a plurality of slits located between adjacent electrode sections, the electrode sections in an upper layer are positioned over the slits in a lower layer, projections of the electrode sections in the layers on substrate are not overlapped with each other, and the layers are separated from each other by a first insulation layer; and the plate electrode is provided under the slit electrode and is separated from the slit electrode by a second insulation layer.

The sum of widths of the electrode sections in all layers of the slit electrode of the pixel structure according to the present invention is far larger than that of the pixel structure according to the prior art, which increases the total opposite area between the electrode sections of the slit electrode and the plate electrode and thereby increases the intensity of the electric field between the slit electrode and the plate electrode. Thus, the area of the shadow zones in the pixel structure is reduced effectively.

Preferably, all the electrode sections in each layer of the slit electrode are electrically connected with each other; and the layers of the slit electrode are electrically connected with each other.

More preferably, all the electrode sections in each layer of the slit electrode are electrically connected with each other by a connector; and the connectors or the electrode sections in different layers of the slit electrode are electrically connected with each other by via holes passing through the first insulation layer or by peripheral lead wires.

Preferably, a width of the slit in any one of the layers of the slit electrode ranges from 3 to 6 μm.

Preferably, a width of the electrode section in any one of the layers of the slit electrode ranges from 2 to 3 μm.

Preferably, the slit electrode includes two layers.

More preferably, the slit electrode serves as a pixel electrode, and the plate electrode serves as a common electrode, or the slit electrode serves as a common electrode, and the plate electrode serves as a pixel electrode.

More preferably, material of the slit electrode is indium tin oxide, and material of the plate electrode is indium tin oxide.

In order to solve the problem, the present invention provides a TFT-LCD array substrate comprising any one of the pixel structures as mentioned above.

Since the array substrate in the present invention comprises the above pixel structure, its transmittance is high.

In order to solve the problem, the present invention provides a display device comprising the above array substrate.

Since the display device comprises the above array substrate, it has better display effect.

Figure 1:
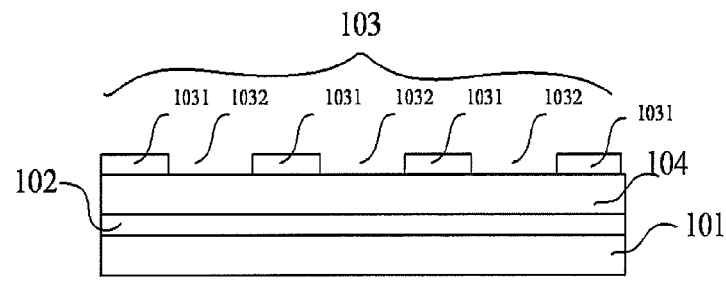
FIG. 1 is a structural diagram of the existing pixel structure.
Figure 2:
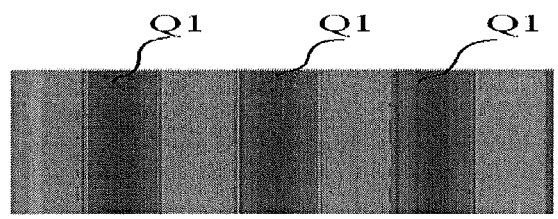
FIG. 2 is a simulation diagram of the luminous intensity of the existing pixel structure.

Reference Numerals in Drawings: 101. substrate; 102. plate electrode; 103. slit electrode; 1031. electrode section; 1032. slit; 104. insulation layer; Q1. shadow zone; S1. transmittance curve of the existing pixel structure; S2. transmittance curve of embodiment 1 of the present invention; 105. connector.

DETAILED DESCRIPTION OF THE EMBODIMENTS

The present invention will be explained in detail below with reference to specific embodiments in conjunction with the drawings so that technical solutions of the present invention can be better understood by the skilled in the art.

Embodiment 1

Figure 3:
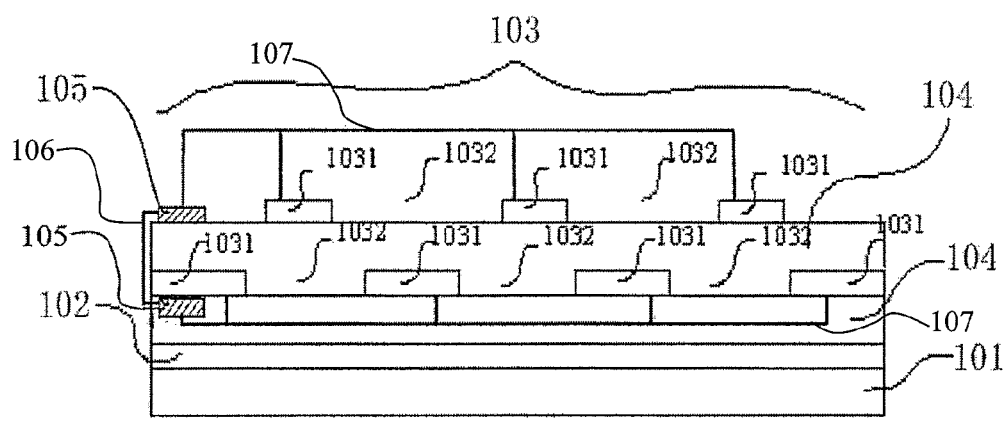
FIG. 3 is a structural diagram of a pixel structure according to embodiment 1 of the present invention.

As shown in FIG. 3, the present embodiment provides a pixel structure comprising a slit electrode 103 and a plate electrode 102. The slit electrode 103 includes at least two layers, each of which includes a plurality of strip-shaped electrode sections 1031 and a plurality of slits 1032 sandwiched between adjacent electrode sections 1031, the electrode sections 1031 in an upper layer is positioned over the slits 1032 in a lower layer, and none of projections on the substrate 101, of the electrode sections 1031 in the layers, are overlapped with each other. The plate electrode 102 is provided under the slit electrode 103 and separated from the slit electrode 103 by an insulation layer 104. Obviously, the layers of the slit electrode 103 are separated with each other by the insulation layer(s) 104. The insulation layer 104 for separating the layers of the slit electrode 103 corresponds to a first insulation layer. The insulation layer 104 for separating the plate electrode 102 from the slit electrode 103 corresponds to a second insulation layer. Although only the slit electrode with two layers is shown in FIG. 3 for ease of description, it will be understood by the skilled in the art that a slit electrode having three or more layers may be used.

Figure 4:
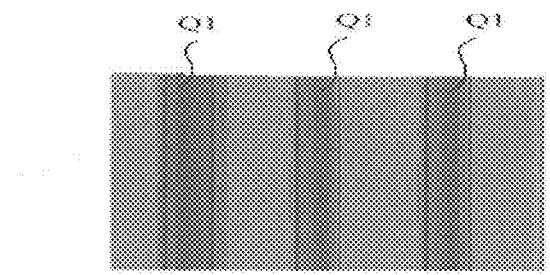
FIG. 4 is a simulation diagram of the luminous intensity of the pixel structure according to embodiment 1 of the present invention.

In the pixel structure, in the case that the width of the slit in the same layer is ensured to be not decreased, the larger the opposite area between the electrode sections 1031 of the slit electrode 103 and the plate electrode 102 is the stronger the electric field intensity between the slit electrode 103 and the plate electrode 102 will be, and thereby the smaller the shadow zones Q1 of the pixel structure will be as shown in FIG. 4). In the present embodiment, the electrode sections 1031 of the slit electrode 103 are disposed in a plurality of layers, so that the projections of the electrode sections 1031 projected on the substrate are not overlapped with each other. It can be easily recognized that the sum of the widths of the projections of the electrode sections 1031 on the substrate 101 in the pixel structure with a multi-layer slit electrode is larger than that in the existing, pixel structure (which may also be conceived as that additional electrode sections 1031 are provided over the slits 1032 of the slit electrode 103 in one layer in the prior art). Thus, the intensity of the electric field between the slit electrode 103 and the plate electrode 102 in the embodiment is larger, which may reduce effectively the distribution area of the shadow zones Q1 and improve the transmittance.

All the electrode sections of each layer of the slit electrode 103 are electrically connected with each other. The layers of the slit electrode 103 are electrically connected with each other.

Herein, each layer of the slit electrode 103 may comprise at least one connector 105 electrically connected 107 with all the electrode sections 1031 in the layer.

The connectors 105 in different layers of the slit electrode 103 may be electrically connected with each other by a via hole (or via holes) passing through the insulation layer(s) between the layers of the slit electrode 103 or by peripheral lead wire(s) 106.

Generally, the connector in a layer may be configured to be electrically connected to ends of the plural electrode sections 1031 on the same side or different sides, so that the electrode sections 1031 in each layer of the slit electrode 103 are electrically connected with each other.

Obviously, the connector in each layer may be configured to be electrically connected to the ends of the electrode sections 1031 on the same side and disposed at the periphery of the pixel structure. Such wiring design is simpler.

Preferably, the width of the slit 1032 in any one of the layers of the slit electrode 103 may range from 3 to 6 μm, and the width of the electrode section 1031 in any one of the layers of the slit electrode 103 may range from 2 to 3 μm. The specific widths of the electrode section 1031 and the slit 1032 may be determined based on actual situations of the processes. The larger the sum of the widths of the electrode sections 1031 in all layers of the slit electrode 103 is, in other words, the smaller the sum of the widths of the slits 1032 is, the stronger the intensity of the electric field between the slit electrode 103 and the plate electrode 102 will be, that is, the higher the transmittance of the pixel structure will be, and the smaller the area of the shadow zones Q1 will be.

Preferably, the slit electrode 103 may include two layers (as shown in FIG. 3). In a direction gradually away from the substrate 101, a first layer of the slit electrode 103 and a second layer of the slit electrode 103 are disposed sequentially. The slit electrode 103 with two layers has advantages of simple manufacture process, simple implementation and low cost.

Preferably, the slit electrode 103 may be the pixel electrode, and the plate electrode 102 may be the common electrode. In turn, the slit electrode 103 may be the common electrode, and the plate electrode 102 may be the pixel electrode.

Herein, the material of the slit electrode 103 may preferably be a transparent conductive material such as indium tin oxide, and the material of the plate electrode 102 may be the same. Since the indium tin oxide material may allow light passing through, the aperture ratio of the pixel structure may be increased significantly. In addition, other transparent material may be used.

Figure 5:
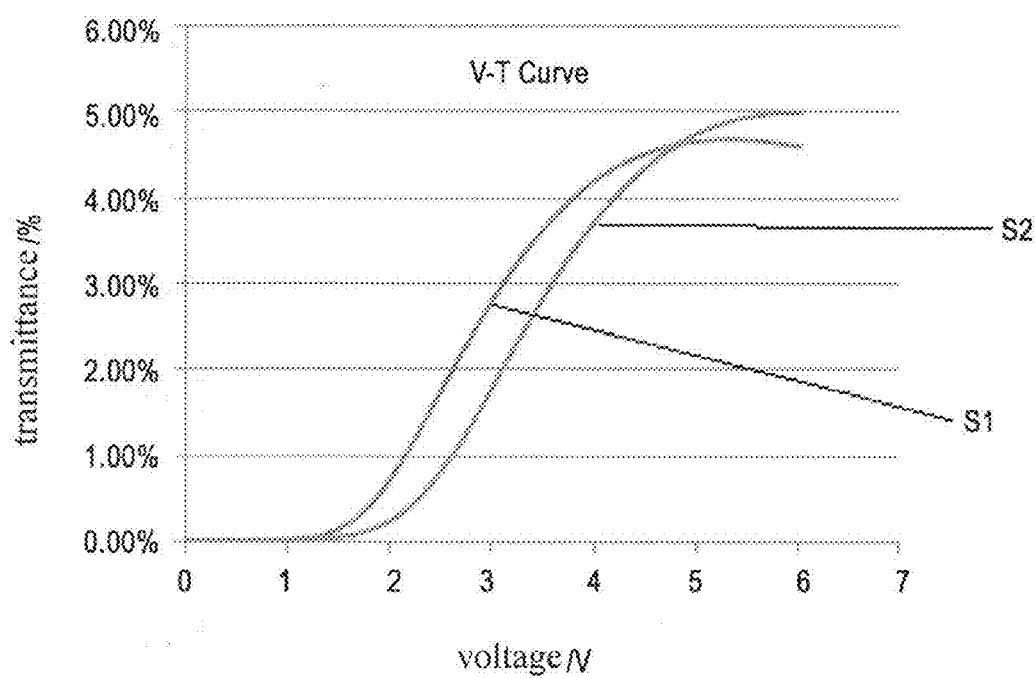
FIG. 5 is a simulation diagram illustrating comparison between the transmittances of the pixel structure of the embodiment 1 of the present invention and the existing pixel structure.

FIG. 5 illustrates the simulation curves of "transmittance vs. pixel electrode voltage" of the pixel structure of the embodiment and the existing pixel structure. Herein, the voltage of the common electrode remains 0V while the voltage of the pixel electrode is in the range of 0-6V. It can be seen from the two simulation curves in which S1 represents the transmittance curve of the existing pixel structure, and S2 represents the transmittance curve of the present embodiment) that the transmittance of the pixel structure of the present embodiment exceeds that of the existing pixel structure after the voltage of the pixel electrode is increased to about 5V.

Herein, the pixel structure of the embodiment may further comprise a storage capacitor (not shown in drawings). The amount of charges stored in the storage capacitor increases as the transmittance improves, which facilitates the charging and the discharging of the pixel structure.

Embodiment 2

The present embodiment provides an array substrate comprising the pixel structure as described in the embodiment 1.

Obviously, other well-known components such as thin film transistor, scanning lines and so on should be included in the array substrate, the specific descriptions of which will be omitted herein.

Since the array substrate of the present embodiment comprises the pixel structure as described in the embodiment 1, it may achieve high-quality display.

Embodiment 3

The present embodiment provides a display device comprising the array substrate as described in the embodiment 2. The display device may be any product or component with display function such as mobile phone, tablet, television, monitor, notebook PC, digital photo frame, navigator, and so on.

Since the display device of the embodiment comprises the array substrate of the embodiment 2, the area of the shadow zones Q1 is reduced, the transmittance is increased and the display effect of the screen is improved.

Obviously, the display device of the present embodiment may further include other conventional components such as power supply unit, display driver unit and so on.

It will be understood that the above embodiments are exemplary implementations for explaining the principle of the invention and not for limiting the present invention. A person skilled in the art can understand that various modifications and improvements may be made without departing from the spirit and substance of the invention and should be deemed as being covered by the invention.

What is claimed is:

1. A pixel structure for horizontal electrical field type TFT-LCD, comprising a slit electrode and a plate electrode, wherein
   the slit electrode includes at least two layers, each of which includes a plurality of strip-shaped electrode sections and a plurality of slits located between adjacent electrode sections, the electrode sections in an upper layer are positioned directly over the slits in a lower layer, projections of the electrode sections in the layers on a substrate are not overlapped with each other, and the layers are separated from each other by a first insulation layer; and
   the plate electrode is provided directly under the slit electrode and is separated from the slit electrode by a second insulation layer,
   wherein all the electrode sections in each layer of the slit electrode are electrically connected with each other and the layers of the slit electrode are electrically connected with each other.

2. The pixel structure according to claim 1, wherein all the electrode sections in each layer of the slit electrode are electrically connected with each other by a connector; and
   the connectors or the electrode sections in different layers of the slit electrode are electrically connected with each other by via holes passing through the first insulation layer or by peripheral lead wires.

3. The pixel structure according to claim 1, wherein a width of the slit in any one of the layers of the slit electrode ranges from 3 to 6 μm.

4. The pixel structure according to claim 1, wherein a width of the electrode section in any one of the layers of the slit electrode ranges from 2 to 3 μm.

5. The pixel structure according to claim 1, wherein the slit electrode includes two layers.

6. The pixel structure according to claim 1, wherein
   the slit electrode serves as a pixel electrode, and the plate electrode serves as a common electrode, or
   the slit electrode serves as a common electrode, and the plate electrode serves as a pixel electrode.

7. The pixel structure according to claim 1, wherein material of the slit electrode is indium tin oxide, and material of the plate electrode is indium tin oxide.

8. A TFT-LCD array substrate comprising the pixel structure according to claim 1.

9. A horizontal electrical field type TFT-LCD comprising the array substrate according to claim 8.

10. The pixel structure according to claim 1, wherein the slit electrode serves as a pixel electrode, and the plate electrode serves as a common electrode, or
   the slit electrode serves as a common electrode, and the plate electrode serves as a pixel electrode.

11. The pixel structure according to claim 3, wherein
   the slit electrode serves as a pixel electrode, and the plate electrode serves as a common electrode, or
   the slit electrode serves as a common electrode, and the plate electrode serves as a pixel electrode.

12. The pixel structure according to claim 4, wherein
   the slit electrode serves as a pixel electrode, and the plate electrode serves as a common electrode, or
   the slit electrode serves as a common electrode, and the plate electrode serves as a pixel electrode.

13. The pixel structure according to claim 5, wherein
   the slit electrode serves as a pixel electrode, and the plate electrode serves as a common electrode, or
   the slit electrode serves as a common electrode, and the plate electrode serves as a pixel electrode.

14. The pixel structure according to claim 1, wherein material of the slit electrode is indium tin oxide, and material of the plate electrode is indium tin oxide.

15. The pixel structure according to claim 3, wherein material of the slit electrode is indium tin oxide, and material of the plate electrode is indium tin oxide.

16. The pixel structure according to claim 4, wherein material of the slit electrode is indium tin oxide, and material of the plate electrode is indium tin oxide.

17. The pixel structure according to claim 5, wherein material of the slit electrode is indium tin oxide, and material of the plate electrode is indium tin oxide.

18. A TFT-LCD array substrate comprising the pixel structure according to claim 13.

19. A TFT-LCD array substrate comprising the pixel structure according to claim 17.

* * * * *